United States Patent
Park et al.

(10) Patent No.: US 7,985,666 B2
(45) Date of Patent: Jul. 26, 2011

(54) METHOD OF MANUFACTURING SILICON NANOWIRES USING SILICON NANODOT THIN FILM

(75) Inventors: Rae-Man Park, Daejeon (KR);
Sang-Hyeob Kim, Daejeon (KR);
Jonghyurk Park, Daegu (KR);
Sunglyul Maeng, Chungcheongbuk-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 402 days.

(21) Appl. No.: 12/304,737

(22) PCT Filed: Dec. 8, 2006

(86) PCT No.: PCT/KR2006/005309
§ 371 (c)(1),
(2), (4) Date: Dec. 12, 2008

(87) PCT Pub. No.: WO2007/145407
PCT Pub. Date: Dec. 21, 2007

(65) Prior Publication Data
US 2009/0325365 A1 Dec. 31, 2009

(30) Foreign Application Priority Data
Jun. 15, 2006 (KR) .................. 10-2006-0053896

(51) Int. Cl.
*H01L 21/20* (2006.01)
*H01L 21/36* (2006.01)

(52) U.S. Cl. ........ 438/503; 438/482; 438/488; 438/492; 438/507; 977/762; 977/778; 977/891; 977/932

(58) Field of Classification Search .................. 438/482, 438/488, 492, 503, 507; 977/762, 778, 891, 977/932
See application file for complete search history.

(56) References Cited

U.S. PATENT DOCUMENTS

| | | | | |
|---|---|---|---|---|
| 5,858,862 A | * | 1/1999 | Westwater et al. ........... | 438/503 |
| 6,383,923 B1 | * | 5/2002 | Brown et al. ................. | 438/666 |
| 6,858,521 B2 | * | 2/2005 | Jin ................ | 438/551 |
| 7,173,304 B2 | * | 2/2007 | Weimer et al. ................ | 257/315 |
| 7,625,812 B2 | * | 12/2009 | Choi et al. ................... | 438/558 |
| 7,833,616 B2 | * | 11/2010 | Jeon et al. .................... | 428/216 |
| 2002/0172820 A1 | | 11/2002 | Majumdar et al. | |
| 2005/0060884 A1 | * | 3/2005 | Okamura et al. ............... | 29/846 |
| 2005/0176264 A1 | | 8/2005 | Lai et al. | |
| 2006/0046480 A1 | | 3/2006 | Guo | |

FOREIGN PATENT DOCUMENTS
JP 2003-142680 5/2003
KR 10-2005-0103023 10/2005

OTHER PUBLICATIONS

X.Q. Yan et al., "H2-assisted control growth of Si nanowires" Journal of crystal growth, 2003, vol. 257, No. 1-2, pp. 69-74.

* cited by examiner

*Primary Examiner* — Kevin M Picardat
*Assistant Examiner* — Bac H Au
(74) *Attorney, Agent, or Firm* — Rabin & Berdo, PC

(57) ABSTRACT

Provided is a method of manufacturing silicon nanowires including: forming a silicon nanodot thin film having a plurality of silicon nanodots exposed on a substrate; and growing the silicon nanowires on the silicon nanodot thin film using the silicon nanodots as a nucleation site. The silicon nanowires can be manufactured using the silicon nanodot thin film disposed in a silicon nitride matrix, as a nucleation site instead of using catalytic metal islands, wherein the silicon nanodot thin film includes the silicon nanodots.

9 Claims, 3 Drawing Sheets

METHOD OF MANUFACTURING SILICON NANOWIRES USING SILICON NANODOT THIN FILM

TECHNICAL FIELD

The present invention relates to a method of manufacturing nanowires, and more particularly, to a method of manufacturing silicon nanowires.

BACKGROUND ART

Silicon nanowires are widely used in high-speed and highly-integrated electrical components and sensors. When silicon nanowires have a diameter of 10 nm or less, a quantum confinement effect occurs and thus, quick charge transfer is possible. According to the conventional art, silicon nanowires are grown on a substrate mainly using a metal catalytic layer.

FIGS. 1 through 3 are cross sectional views illustrating a conventional method of manufacturing silicon nanowires.

Specifically, a metal catalytic layer 12, for example, a gold (Au) layer, is deposited on a substrate 10 (FIG. 1). Then the metal catalytic layer 12 is converted into catalytic metal islands 14. The catalytic metal islands 14 are self-formed at a high temperature in a nanowire growth apparatus used in a later process, for example, a thermal chemical vapor deposition apparatus. The diameter of the self-formed catalytic metal islands 14 is large, in the order of tens of nm, for example, 20 nm or larger and the areal density (number of catalytic metal islands 14 per unit area) thereof is very low, that is, $10^{10}/cm^2$ (FIG. 2).

Next, a silicon source is provided to a growth apparatus for growing silicon nanowires and silicon nanowires 16 are grown on the substrate 10 using the catalytic metal islands 14 as a catalyst. The catalytic metal islands 14 support crystal growth in the silicon nanowires 16. According to the size (diameter) of the catalytic metal islands 14, the size (diameter) of the silicon nanowires 16 is determined (FIG. 3).

DISCLOSURE OF INVENTION

Technical Problem

However, according to the conventional art described above, the areal density of the catalytic metal islands 14 is very low, that is, around $10^{10}$ cm$^2$ and thus, it is difficult to manufacture silicon nanowires 16 with higher density. In addition, in the conventional art, though not illustrated in FIG. 3, when a plurality of silicon nanowires 16 are grown on the catalytic metal islands 14, each of the silicon nanowires 16 obstructs growth of the other silicon nanowires 16.

In addition, since the diameter of the catalytic metal islands 14 is large, in the order of tens of nm, for example, 20 nm or larger, the diameter of the grown silicon nanowires 16 is also large, that is, 20 nm or larger. It is difficult for such silicon nanowires 16 to have a property of single crystal. Also, quick charge transfer occurring due to the
quantum confinement effect cannot be expected.

Technical Solution

The present invention provides a method of manufacturing silicon nanowires without using catalytic metal islands.

The present invention also provides a method of manufacturing silicon nanowires having a diameter of 10 nm or less and an areal density of $10^{12}$ cm$^{-2}$ or more without using catalytic metal islands.

The present invention also provides a method of manufacturing silicon nanowires using a silicon nanodot thin film as a nucleation site.

The present invention also provides a method of manufacturing silicon nanowires having a diameter of 10 nm or less and an areal density of $10^{12}$ cm$^{-2}$ or above using a silicon nanodot thin film as a nucleation site.

According to an aspect of the present invention, there is provided a method of manufacturing silicon nanowires including: forming a silicon nanodot thin film having a plurality of silicon nanodots exposed on a substrate; and growing the silicon nanowires on the silicon nanodot thin film using the silicon nanodots as a nucleation site.

The silicon nanodots in the silicon nanodot thin film may be formed in a silicon nitride matrix. The silicon nanodots may have a crystalline or amorphous structure.

According to another aspect of the present invention, there is provided a method of manufacturing silicon nanowires including: forming a silicon nanodot thin film having a plurality of silicon nanodots exposed on a substrate; and growing the silicon nanowires on one silicon nanodot each using the exposed silicon nanodots as a nucleation site.

The silicon nanodot thin film may include the silicon nanodots formed in a silicon nitride matrix.

The silicon nanodots may have a diameter of 5 nm or less and an areal density of $10^{12}$ cm$^{-2}$ or more and the silicon nanowires may have a diameter of 10 nm.

The silicon nanodots may be formed in a silicon nitride matrix on a substrate and the silicon nanowires may be formed only on the silicon nanodot thin film, instead of the silicon nitride matrix, using the silicon nanodots included in the silicon nitride matrix as a nucleation site.

Advantageous Effects

As described above, the silicon nanowires can be manufactured using the silicon nanodot thin film disposed in a silicon nitride matrix, as a nucleation site instead of using catalytic metal islands, wherein the silicon nanodot thin film includes the silicon nanodots. Silicon nanowires having a diameter of 10 nm or less can be manufactured since the diameter of the silicon nanodots is 5 nm or less. Therefore, a quantum confinement effect occurs and thus, quick charge transfer is possible. In addition, the areal density of the silicon nanodot can be made to be larger than $10^{12}$ cm$^{-2}$ in the present invention and one silicon nanowire is grown on one silicon nanodot, thereby manufacturing silicon nanowires with high density.

BRIEF DESCRIPTION OF THE DRAWINGS

The above and other features and advantages of the present invention will become more apparent by describing in detail exemplary embodiments thereof with reference to the attached drawings in which.

MODE FOR THE INVENTION

Figure 1:
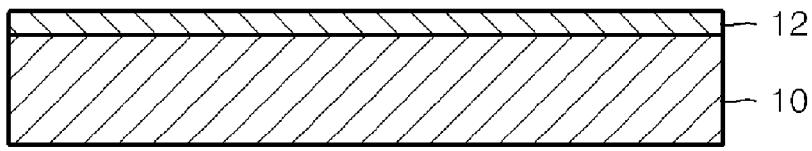
FIGS. 1 through 3 are cross sectional views illustrating a conventional method of manufacturing silicon nanowires.
Figure 2:
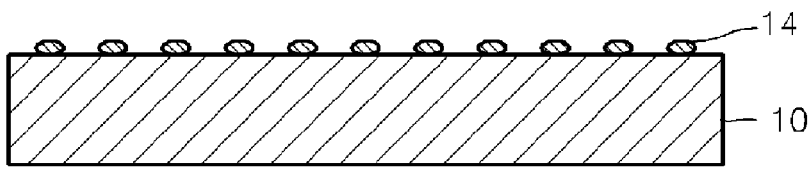
Figure 3:
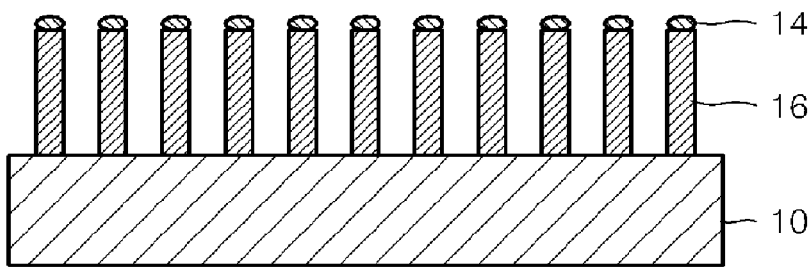

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like elements, and the sizes and thicknesses of layers and regions are exaggerated for clarity.

Figure 4:
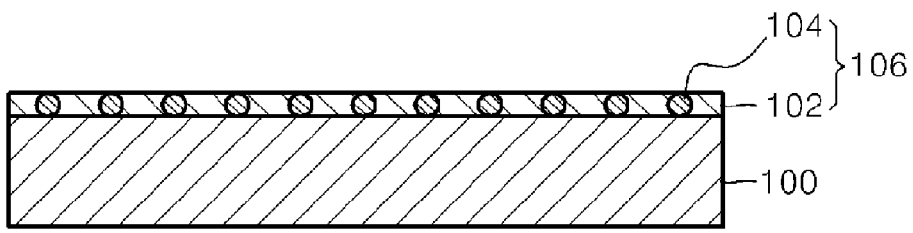
FIGS. 4 and 5 are cross sectional views illustrating a method of manufacturing silicon nanowires according to an embodiment of the present invention.
Figure 5:
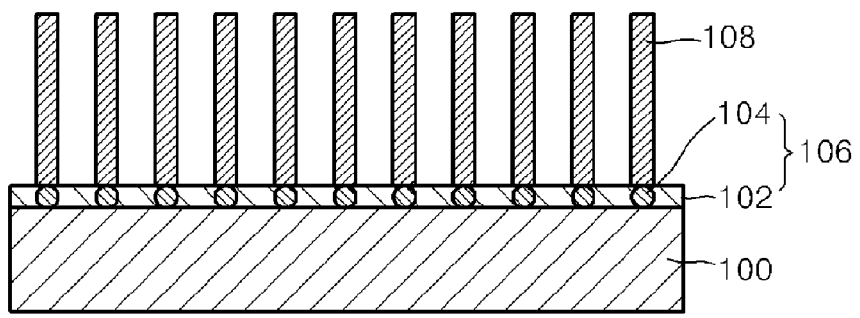

FIGS. 4 and 5 are cross sectional views illustrating a method of manufacturing silicon nanowires according to an embodiment of the present invention.

Referring to FIG. 4, a silicon nanodot thin film 106 is formed on a substrate 100, for example, a silicon substrate, a glass substrate, or a metal substrate, wherein the silicon nanodot thin film 106 includes a silicon nitride matrix 102 having a plurality of silicon nanodots 104 therein.

The silicon nanodots 104 are formed on the substrate 100 and the surfaces of the silicon nanodots 104 are exposed. When the surfaces of the silicon nanodots 104 are exposed, silicon nanowires 108 (FIG. 5) can be grown. Of course, although the surfaces of the silicon nanodots 104 are not exposed completely, the silicon nanowires 108 can be grown. According to an embodiment of the present invention, the silicon nanodots 104 may have a crystalline or amorphous structure.

The silicon nanodots 104 according to the current embodiment of the present invention may be spherical having a diameter of 5 nm or less, for example, 1 through 5 nm, and an areal density of $10^{12}$ cm$^{-2}$ or more, for example, $10^{12}$ cm$^{-2}$ through $10^{13}$ cm$^{-2}$. A method of manufacturing the silicon nanodot thin film 106 will be described more fully later.

Referring to FIG. 5, the silicon nanodot thin film 106 is treated as a nucleation site to grow the silicon nanowires 108. In particular, the silicon nanodots 104 of which the surfaces thereof are exposed are treated as a nucleation site to grow the silicon nanowires 108. Since one silicon nanowire 108 is grown on one silicon nanodot 104, wherein the silicon nanodots 104 are included in the silicon nitride matrix 102, the silicon nanowires 108 do not obstruct each other's growth.

The diameter of the silicon nanodots 104 is 5 nm or less. Therefore, although the silicon nanowires 108 are oxidized, thereby forming an oxide layer on the outer wall thereof, the diameter of the silicon nanowires 108 can be adjusted to 10 nm or less, for example, 2 through 10 nm. Accordingly, as the silicon nanowires 108 according to the current embodiment of the present invention have a diameter of 10 nm or less, quantum confinement effect occurs and thus, quick charge transfer is possible. In addition, the areal density of the silicon nanodots 104 can be made larger than $10^{12}$ cm$^{-2}$ according to the current embodiment of the present invention and thus, the silicon nanowires 108 can be manufactured to have high density. A method of growing the silicon nanowires 108 will be described more fully later.

The apparatus used to form the silicon nanodot thin film 106 according to an embodiment of the present invention is a plasma enhanced chemical vapor deposition (PECVD) apparatus. However, the silicon nanodot thin film 106 can also be manufactured using an atmospheric pressure CVD (APCVD) apparatus, a low pressure CVD (LPCVD) apparatus, a metal organic CVD (MOCVD) apparatus, and a thermal CVD apparatus, in addition to the PECVD apparatus. When the silicon nanodots 104 are formed using chemical vapor deposition, a silicon source gas such as $SiCl_4$, $SiHCl_3$, $SiH_2Cl_2$, $SiH_4$, or $Si_2H_6$ can be used.

In addition, a Molecular Beam Epitaxy (MBE) apparatus and an ion implantation apparatus also can be used to form the silicon nanodot thin film 106. When the silicon nanodots 104 are formed using the MBE apparatus, a lump of solid silicon is used. When the silicon nanodots 104 are formed using the ion implantation apparatus, protons of silicon atoms or electrons of silicon atoms can be used.

An apparatus for forming a silicon nanodot thin film and a method of manufacturing the same will now be described with reference to FIGS. 6 and 7.

Figure 6:
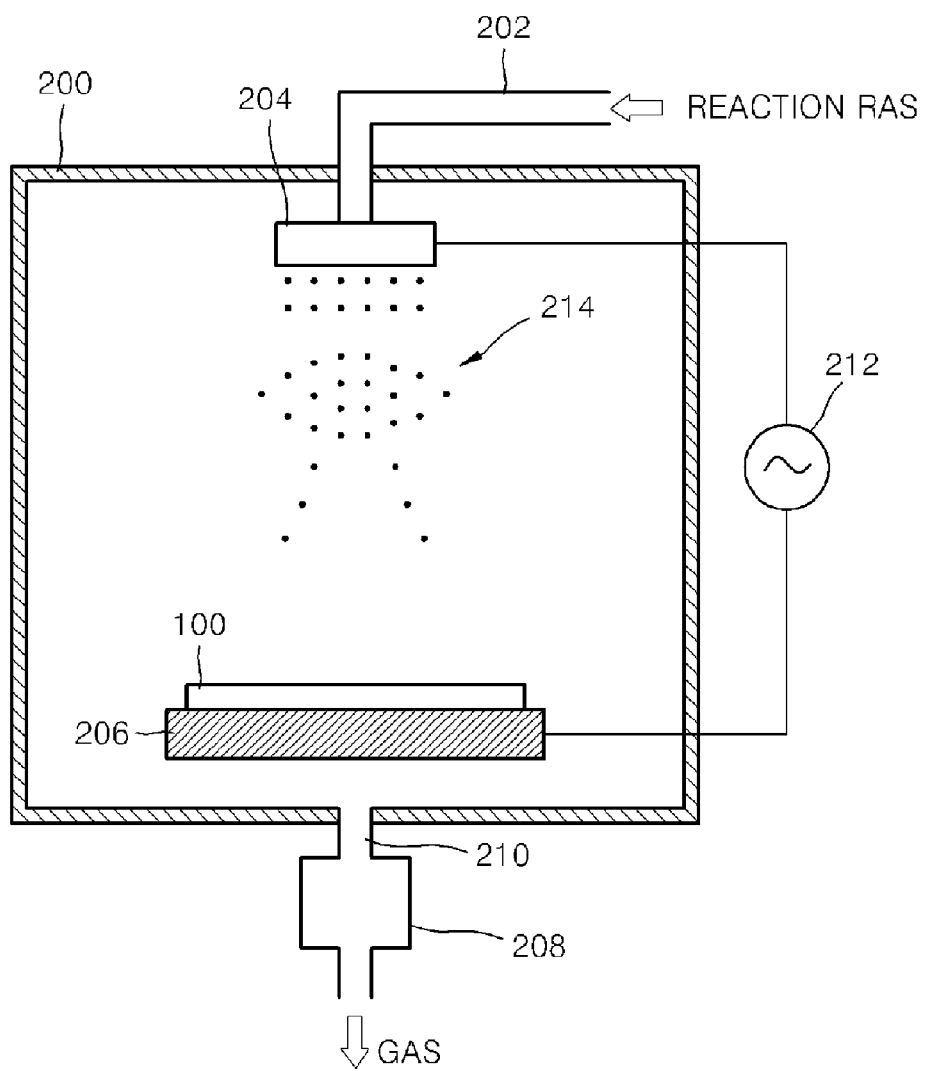
FIG. 6 is a schematic diagram of an apparatus used to manufacture a silicon nanodot thin film according to an embodiment of the present invention.
Figure 7:
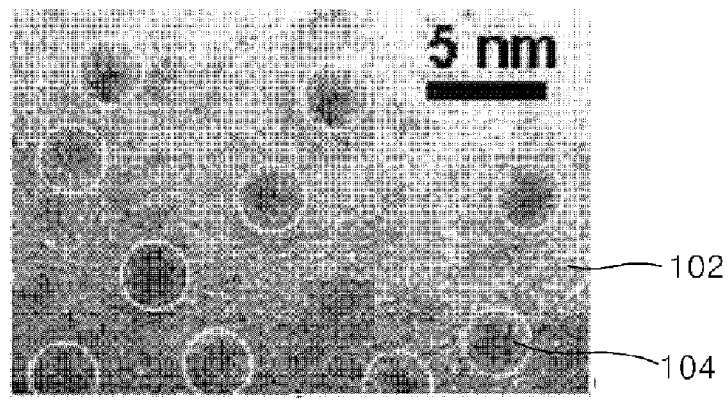
FIG. 7 is a sectional photograph illustrating a silicon nanodot thin film included in the silicon nanowires of FIG. 4 manufactured using the apparatus of FIG. 6, according to an embodiment of the present invention.

FIG. 6 is a schematic diagram of an apparatus used to manufacture the silicon nanodot thin film 106 according to an embodiment of the present invention and FIG. 7 is a sectional photograph illustrating the silicon nanodot thin film 106 included in the silicon nanowires 108 of FIG. 4 manufactured using the apparatus of FIG. 6, according to an embodiment of the present invention.

Specifically, a PECVD apparatus is used to form the silicon nanodot thin film 106 according to an embodiment of the present invention. Referring to FIG. 6, the PECVD apparatus includes a gas supplying pipe 202 disposed above a chamber 200, a shower head 204 connected to the gas supplying pipe 202, and a stage 206 disposed in the lower part of the chamber 200, wherein the stage 206 includes a substrate 100 thereon. A gas exhaust pipe 210 connecting with an air pump 208 is installed on the lower part of the chamber 200.

A process of manufacturing the silicon nanodot thin film 106 using the apparatus described above will now be described. The substrate 100 is disposed on the stage 206. Then, reaction gas is injected into the chamber 200 through the gas supplying pipe 202 and then, RF power 212 is applied to the shower head 204 and the stage 206, which act as an upper electrode and a lower electrode, respectively. Accordingly, plasma 214 is generated and the silicon nitride matrix 102 is formed when the plasma 214 moves downward. Here, the reaction gas, the temperature of the substrate 100, pressure, and plasma state are controlled to form the silicon nanodots 104 in the silicon nitride matrix 102. Consequently, the silicon nanodot thin film 106 is formed on the substrate 100.

In particular, the pressure and the temperature of the chamber 200 are set to 0.1 through 1 Torr and room temperature through 300° C., respectively. Then, a mixture gas of silane gas as silicon source gas and nitrogen gas (ammonia gas) as nitrogen source gas flows into the chamber 200 while applying RF power of 10 W to form the silicon nanodot thin film 106. 5 through 100 sccm of silane gas, 100 through 2000 sccm of nitrogen gas, and 10 through 200 sccm of ammonia gas are injected into the chamber 200. The growth rate of the silicon nanodot thin film 106 is determined according to the flow rate of the silane gas and the nitrogen gas. In the silicon nanodot thin film 106 formed according to the process described above, the silicon nanodots 104 have a diameter of 5 nm or less and an areal density of $10^{12}$ cm$^{-2}$ or more.

Figure 8:
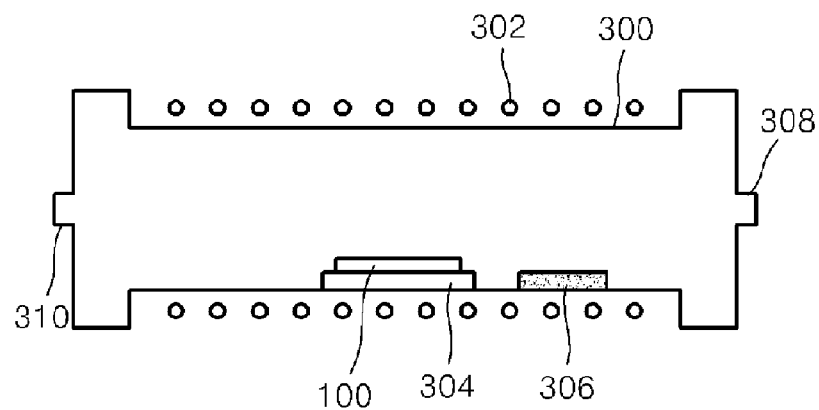
FIG. 8 is a schematic diagram of an apparatus used to grow the silicon nanowires of FIG. 5, according to an embodiment of the present invention.
Figure 9:
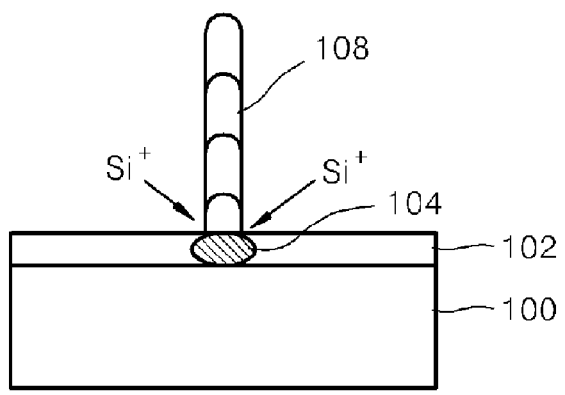
FIG. 9 is a schematic diagram illustrating a growth mechanism of the silicon nanowires of FIG. 5, according to an embodiment of the present invention.

FIG. 8 is a schematic diagram of an apparatus used to grow the silicon nanowires 108 of FIG. 5, according to an embodiment of the present invention and FIG. 9 is a schematic diagram illustrating a growth mechanism of the silicon nanowires 108 of FIG. 5, according to an embodiment of the present invention.

Specifically, a thermal CVD apparatus is used as the growth apparatus for growing the silicon nanowires 108. Referring to FIG. 8, the thermal CVD apparatus includes a chamber 300 including a heater 302, a boat 304 in which a substrate 100 is disposed, in the chamber 300, and a silicon powder source 306 adjacent to the boat 304. The silicon powder source 306 may be silicon powder or a mixture powder of silicon oxide and carbon. The chamber 300 includes a gas inlet hole 308 and a gas outlet hole 310 on respective sides thereof. The silicon powder source 306 is used to grow the silicon nanowires 108, however, silicon source gas described in forming the silicon nanodots 104 can also be used using the gas inlet hole 308 and the gas outlet hole 310.

A process of growing the silicon nanowires 108 using the growth apparatus described above will now be described. The substrate 100 is disposed on the boat 304. Then the chamber 300 is heated to a growth temperature of 700 through 1000° C. and 100 through 1000 sccm of argon gas flows into the chamber 300 through the gas inlet hole 308. Then silicon is decomposed in the silicon powder source 306 to obtain silicon ions (or silicon atoms) and the obtained silicon ions (or silicon atoms) are absorbed in the silicon nanodots 104 to be dissolved. When silicon atoms are continuously diffused into the silicon nanodots 104, the silicon nanowire 108s are grown in a bamboo form on the silicon nanodots 104.

When silicon is dissolved in the silicon powder source 306, the silicon nitride matrix 102 is formed around the silicon nanodots 104. However, a reaction between the silicon nanodots 104 and silicon is better than a reaction between the silicon nitride matrix 102 and silicon and thus, the silicon nanowires 108 do not grow in the silicon nitride matrix 102.

As described above, silicon nanowires can be manufactured without using catalytic metal islands according to the present invention.

In the present invention, silicon nanowires can be manufactured using a silicon nanodot thin film as a nucleation site, wherein the silicon nanodot thin film includes silicon nanodots in a silicon nitride matrix.

In the present invention, silicon nanowires having a diameter of 10 nm or less can be manufactured since the diameter of the silicon nanodots is 5 nm or less. Therefore, a quantum confinement effect occurs and thus, quick charge transfer is possible.

In addition, the areal density of the silicon nanodot can be made to be larger than $10^{12}$ $cm^{-2}$ in the present invention and one silicon nanowire is grown on one silicon nanodot, thereby manufacturing silicon nanowires with high density.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention provides method of manufacturing nanowires, and more particularly, to a method of manufacturing silicon nanowires.

The invention claimed is:

1. A method of manufacturing silicon nanowires comprising:
   forming a silicon nanodot thin film having a plurality of silicon nanodots exposed on a substrate; and
   growing the silicon nanowires on the silicon nanodot thin film using the silicon nanodots as a nucleation site.

2. The method of claim 1, wherein the silicon nanodots in the silicon nanodot thin film are formed in a silicon nitride matrix.

3. The method of claim 1, wherein the silicon nanodots have a crystalline or amorphous structure.

4. The method of claim 1, wherein the silicon nanowires are grown using a method of thermal chemical deposition.

5. A method of manufacturing silicon nanowires comprising:
   forming a silicon nanodot thin film having a plurality of silicon nanodots exposed on a substrate; and
   growing the silicon nanowires on one silicon nanodot each using the exposed silicon nanodots as a nucleation site.

6. The method of claim 5, wherein the silicon nanodot thin film comprises the silicon nanodots formed in a silicon nitride matrix.

7. The method of claim 5, wherein the silicon nanodots have a diameter of 5 nm or less and an areal density of $10^{12}$ $cm^{-2}$ or more and the silicon nanowires have a diameter of 10 nm.

8. The method of claim 5, wherein the silicon nanowires are oxidized, thereby forming an oxide layer on the outer wall thereof, and wherein the diameter of the silicon nanowires is 10 nm or less.

9. The method of claim 5, wherein the silicon nanodots are formed in a silicon nitride matrix on a substrate and the
   silicon nanowires are formed only on the silicon nanodot, and not the silicon nitride matrix, using the silicon nanodots included in the silicon nitride matrix as a nucleation site.

* * * * *